United States Patent
Yamazaki et al.

(10) Patent No.: US 7,071,035 B2
(45) Date of Patent: *Jul. 4, 2006

(54) APPARATUS AND METHOD FOR LASER RADIATION

(75) Inventors: Shunpei Yamazaki, Tokyo (JP); Satoshi Teramoto, Kanagawa (JP); Naoto Kusumoto, Kanagawa (JP); Koichiro Tanaka, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 47 days.

This patent is subject to a terminal disclaimer.

(21) Appl. No.: 10/443,267

(22) Filed: May 21, 2003

(65) Prior Publication Data

US 2003/0202251 A1 Oct. 30, 2003

Related U.S. Application Data

(60) Continuation of application No. 10/024,855, filed on Dec. 18, 2001, now Pat. No. 6,587,277, which is a continuation of application No. 09/812,360, filed on Mar. 19, 2001, now Pat. No. 6,388,812, which is a continuation of application No. 09/583,450, filed on May 30, 2000, now Pat. No. 6,215,595, which is a continuation of application No. 09/291,804, filed on Apr. 14, 1999, now Pat. No. 6,157,492, which is a division of application No. 08/797,965, filed on Feb. 6, 1997, now Pat. No. 5,900,980.

(30) Foreign Application Priority Data

Feb. 6, 1996 (JP) ........................... 8-44306

(51) Int. Cl.
*H01L 21/00* (2006.01)
*H01L 21/20* (2006.01)

(52) U.S. Cl. .............. 438/149; 438/151; 438/166; 438/486; 438/487; 438/795

(58) Field of Classification Search ........... 438/149, 438/151, 167, 482, 486, 487, 795
See application file for complete search history.

(56) References Cited

U.S. PATENT DOCUMENTS

| | | | |
|---|---|---|---|
| 3,667,832 A | 6/1972 | Kitano et al. | 359/653 |
| 4,733,944 A | 3/1988 | Fahlen et al. | 359/624 |
| 4,943,733 A | 7/1990 | Mori et al. | 250/548 |
| 5,097,291 A | 3/1992 | Suzuki | 355/69 |
| 5,263,250 A | 11/1993 | Nishiwaki et al. | 29/890.1 |

(Continued)

FOREIGN PATENT DOCUMENTS

JP 09275081 * 10/1997

OTHER PUBLICATIONS

Pennington, K.S. et al., "CCD Imaging Array Combining Fly's-Eye Lense with TDI for Incrased Light-Gathering Ability," IBM Technical Disclosure Bulletin 21(2):857-858 (1978).

*Primary Examiner*—Mary Wilczewski
*Assistant Examiner*—Toniae M. Thomas
(74) *Attorney, Agent, or Firm*—Fish & Richardson P.C.

(57) ABSTRACT

There is provided an improvement on homogeneity of annealing performed utilizing radiation of a laser beam on a silicon film having a large area. In a configuration wherein a linear laser beam is applied to a surface to be irradiated, optimization is carried out on the width and number of cylindrical lenses forming homogenizers 103 and 104 for controlling the distribution of radiation energy density in the longitudinal direction of the linear beam. For example, the width of the cylindrical lenses forming the homogenizers 103 and 104 is set in the range from 0.1 mm to 5 mm, and the number of the lenses is chosen such that one lens is provided for every 5 mm–15 mm along the length of the linear laser beam in the longitudinal direction thereof. This makes it possible to improve homogeneity of the radiation energy density of the linear laser in the longitudinal direction thereof.

10 Claims, 9 Drawing Sheets

U.S. PATENT DOCUMENTS

| | | | |
|---|---|---|---|
| 5,414,559 A | 5/1995 | Burghardt et al. | 359/623 |
| 5,561,081 A | 10/1996 | Takenouchi et al. | 438/166 |
| 5,587,330 A * | 12/1996 | Yamazaki | 438/162 |
| 5,657,138 A | 8/1997 | Lewis et al. | 359/15 |
| 5,721,416 A | 2/1998 | Burghardt et al. | 219/121.73 |
| 5,756,364 A | 5/1998 | Tanaka et al. | 438/30 |
| 5,815,494 A | 9/1998 | Yamazaki et al. | 372/25 |
| 5,854,803 A | 12/1998 | Yamazaki et al. | 372/31 |
| 5,858,822 A | 1/1999 | Yamazaki et al. | 438/166 |
| 5,893,990 A | 4/1999 | Tanaka | 219/121.8 |
| 5,897,799 A | 4/1999 | Yamazaki et al. | 219/121.75 |
| 5,900,980 A | 5/1999 | Yamazaki et al. | 359/619 |
| 5,907,770 A | 5/1999 | Yamazaki et al. | 438/149 |
| 5,923,966 A | 7/1999 | Teramoto et al. | 438/162 |
| 5,959,779 A | 9/1999 | Yamazaki et al. | 359/624 |
| 6,104,535 A | 8/2000 | Tanaka | 359/619 |
| 6,137,633 A | 10/2000 | Tanaka | 359/619 |
| 6,157,492 A | 12/2000 | Yamazaki et al. | 359/623 |
| 6,215,595 B1 | 4/2001 | Yamazaki et al. | 359/623 |
| 6,388,812 B1 | 5/2002 | Yamazaki et al. | 359/623 |
| 6,587,277 B1 * | 7/2003 | Yamazaki et al. | 359/623 |

* cited by examiner

APPARATUS AND METHOD FOR LASER RADIATION

CROSS-REFERENCE TO RELATED APPLICATIONS

This application is a continuation of U.S. application Ser. No. 10/024,855, filed Dec. 18, 2001, now U.S. Pat. No. 6,587,277, which is a continuation of U.S. application Ser. No. 09/812,360, filed Mar. 19, 2001, now U.S. Pat. No. 6,388,812, which is a continuation of U.S. application Ser. No. 09/583,450, filed May 30, 2000, now U.S. Pat. No. 6,215,595, which is a continuation of U.S. application Ser. No. 09/291,804, filed Apr. 14, 1999, now U.S. Pat. No. 6,157,492, which is a divisional of U.S. application Ser. No. 08/797,965, filed Feb. 6, 1997 now U.S. Pat. No. 5,900,980.

BACKGROUND OF THE INVENTION

1. Field of the Invention

The present invention relates to an apparatus for annealing a semiconductor material by means of irradiation with a laser beam.

2. Description of Related Art

Techniques for crystallizing amorphous silicon films by irradiating them with a laser beam have been known. Other techniques have been known wherein irradiation with a laser beam is performed to recover crystallinity of a silicon film which has been damaged as a result of implantation of impurity ions and to activate implanted impurity ions.

As a typical example of the latter kind of techniques, a technique has been known wherein regions which are to become a source and a drain of a thin film transistor are annealed by irradiating them with a laser beam after implanting impurity ions which are typically phosphorus or boron.

Such a process utilizing irradiation with a laser beam (generally referred to as "laser process") is characterized in that it causes substantially no thermal damage to a substrate. This is because a method utilizing irradiation with a laser beam only instantaneously heat the irradiated surface and the effect of the heating is not extended to the substrate.

This feature of causing no thermal damage to a substrate is important in fabricating active matrix type liquid crystal displays which recently have an expanding range of application.

There are demands for use of glass substrates as substrates of active matrix type liquid crystal displays from the viewpoint of cost and needs for such displays with a larger surface area.

However, a glass substrate can not withstand a heating process at temperatures as high as 600° C. or more or 700° C. or more. One effective technique for avoiding this problem is to perform the crystallization of a silicon film and the annealing after implantation of impurity ions as described above utilizing irradiation with a laser beam.

According to a method utilizing irradiation with laser beams, even if a glass substrate is used, there is substantially no thermal damage to the glass substrate. It is therefore possible to fabricate a thin film transistor having a crystalline silicon film even with a glass substrate.

However, since the area of a laser beam is small, a laser process has problems including low efficiency in processing a large area and low homogeneity in processing a large area.

SUMMARY OF THE INVENTION

It is an object of the present invention to provide a technique for a laser process used in fabrication of semiconductor devices wherein homogeneous annealing can be performed on a large area.

Figure 1A:
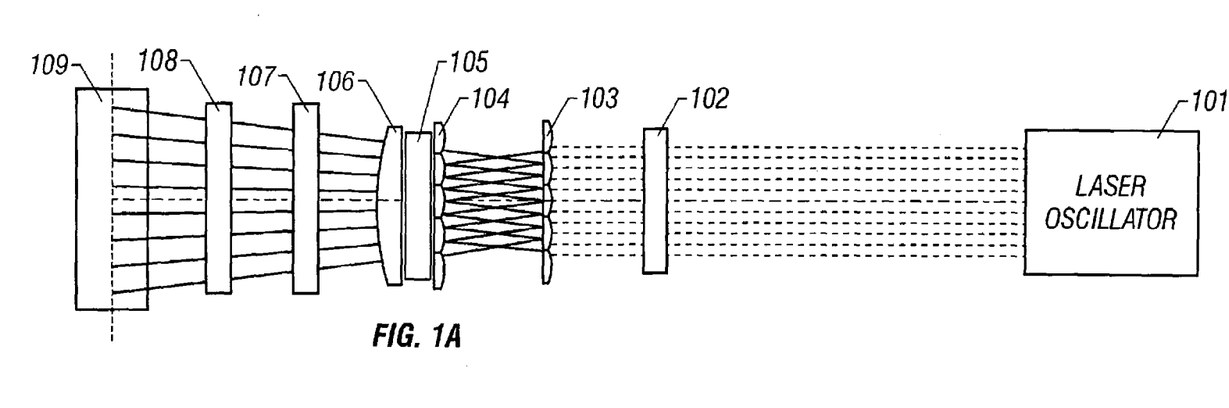
FIGS. 1(A) and 1(B) schematically show an optical system of a laser radiation apparatus.
Figure 1B:
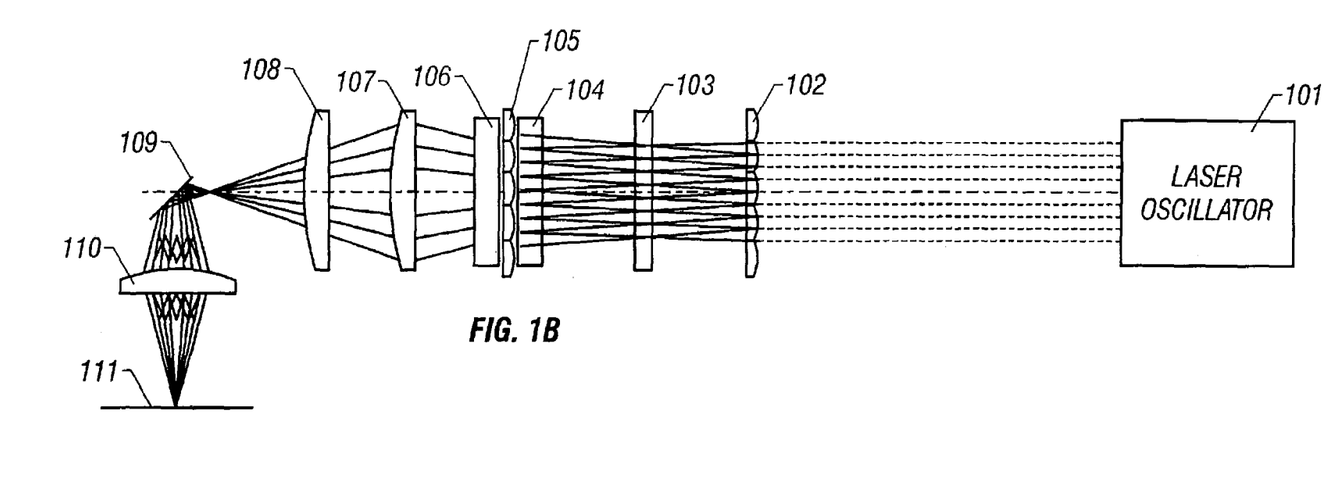

FIGS. 1(A) and 1(B) show an example of a laser radiation apparatus that employs the present invention. In FIGS. 1(A) and 1(B), 101 designates a laser oscillator which oscillates a laser beam by decomposing a predetermined gas using high frequency discharge to realize a state referred to as "excimer state".

For example, a KrF excimer laser oscillates a laser beam by means of high frequency discharge using Kr and F as material gases.

102 through 105 designate homogenizers. A homogenizer is constituted by a set of cylindrical lenses. The homogenizers 102 and 105 have a function of splitting a laser beam oscillated by the laser oscillator into parallel beams in a vertical direction to perform optical correction in the vertical direction.

The optical correction in the vertical direction contributes to homogenization of the energy density of a laser beam in the direction of the width of a line into which the laser beam is ultimately shaped.

Further, the homogenizers 103 and 104 have a function of splitting a beam in a horizontal direction to perform optical correction in the horizontal direction.

The optical correction in the horizontal direction contributes to homogenization of the energy density of a laser beam in the longitudinal direction of a line into which the laser beam is ultimately shaped.

106 designates a lens for controlling focusing of a laser beam in the horizontal direction. The lens 106 contributes to focusing of a linear laser beam in the longitudinal direction thereof.

107, 108 and 110 designate a lens system for controlling focusing of a linear laser beam in the direction of the width thereof. The primary function of this lens system is to shape the ultimately radiated laser beam into a linear configuration. 109 designates a mirror. A laser beam reflected by the mirror 109 is ultimately directed to a surface to be irradiated 111 through the lens 110.

For example, the surface to be irradiated 111 is a surface of an amorphous silicon film or a surface of a crystalline silicon film on which crystallinity is to be enhanced.

What is important is the setting of optical parameters of the homogenizers 103 and 104 for controlling the distribution of the radiation energy density of a laser beam in the horizontal direction (which corresponds to the longitudinal direction of the linear laser beam).

In general, variation occurs in the radiation energy density in the longitudinal direction of a linear laser beam unless the optical parameters of the homogenizers 103 and 104 are properly set.

The present invention is characterized in that variation in the radiation energy density in the longitudinal direction of a linear laser beam is corrected by optimizing the optical parameters of the homogenizers 103 and 104.

A set of the homogenizers 102 and 105 is provided in a different direction than another set of the homogenizers 103 and 104.

Figure 3A:
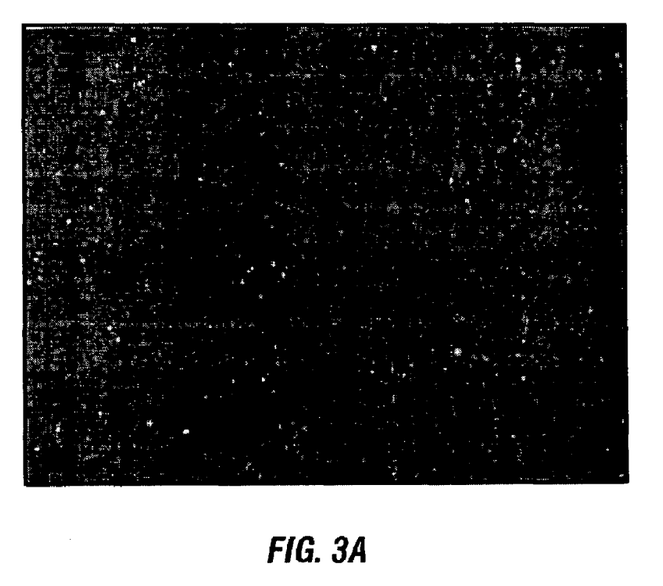
FIGS. 3(A) and 3(B) are photographs showing a thin film.
Figure 3B:
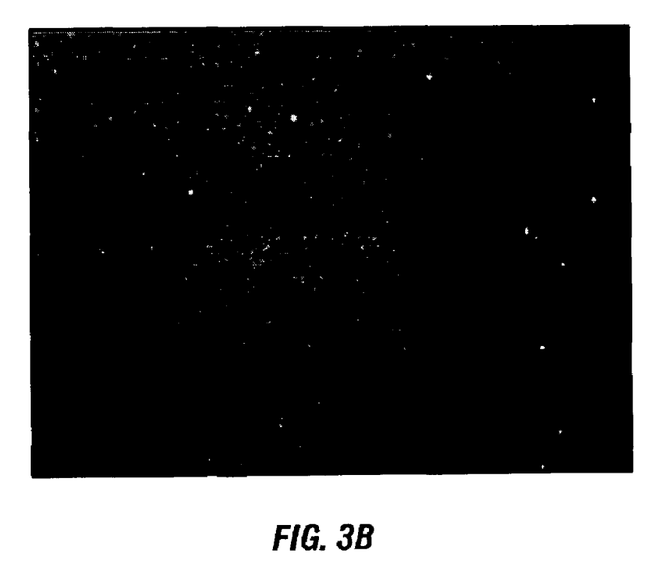

FIGS. 3(A) and 3(B) show photographs of a surface of a crystalline silicon film obtained by irradiating an amorphous silicon film with a laser beam.

FIG. 3(A) shows the result of annealing performed by forming the homogenizer 104 in FIGS. 1(A) and 1(B) using twelve cylindrical lenses having a width of 5 mm.

FIG. 3(B) shows the result of annealing performed by forming the homogenizer 104 in FIGS. 1(A) and 1(B) using five cylindrical lenses having a width of 6.5 mm.

Figure 2:
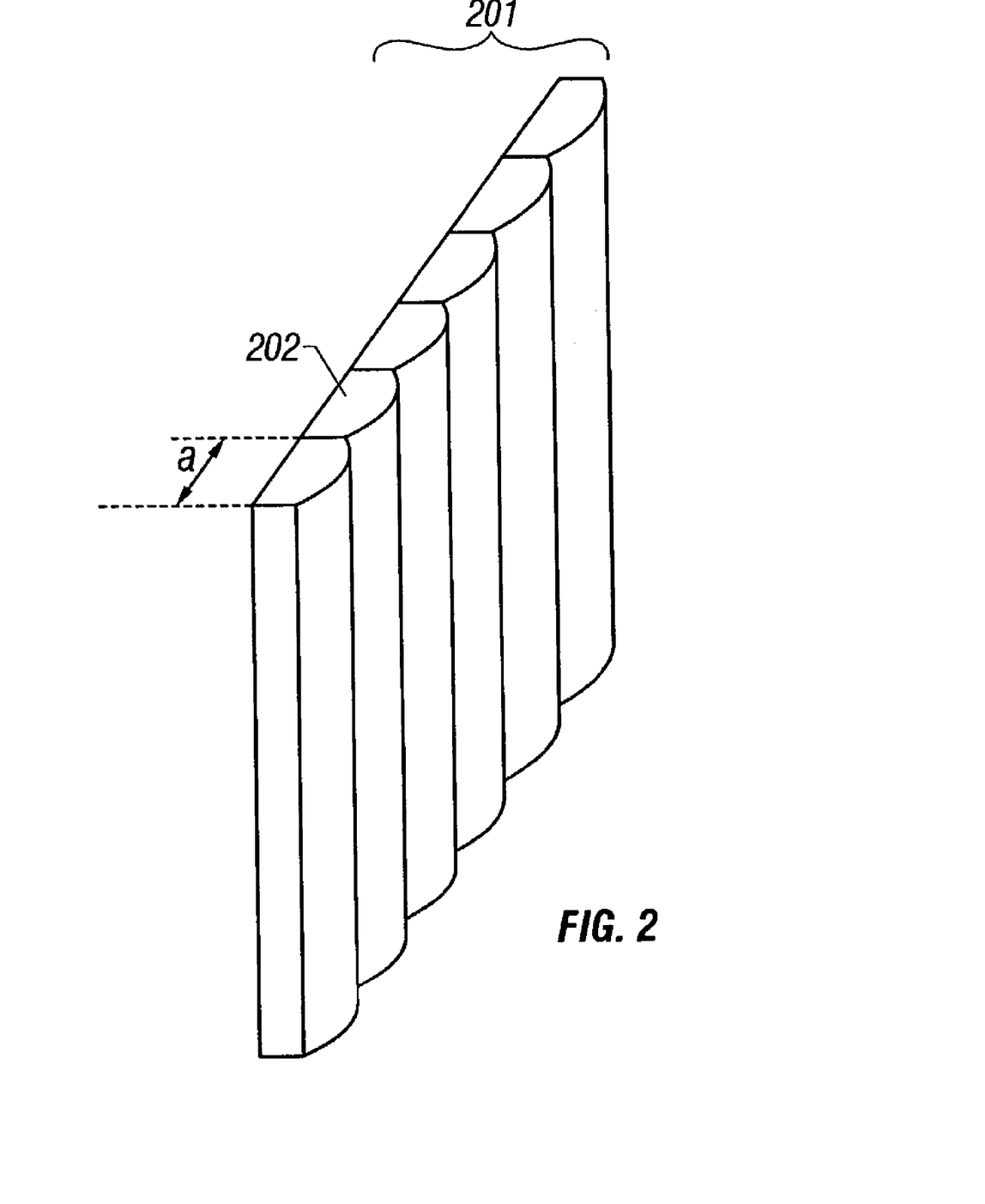
FIG. 2 is a schematic view showing a configuration of a homogenizer.

FIG. 2 is an enlarged view of the homogenizer indicated by 104 in FIGS. 1(A) and 1(B). The homogenizer 201 is constituted by a plurality of cylindrical lenses 202.

Importantly, the number of the cylindrical lenses in the direction of the width of a laser beam incident upon the homogenizer is 7 or more, preferably 10 or more. The direction of the width of the laser beam must coincide or substantially coincide with the longitudinal direction of the line into which the laser beam is ultimately shaped.

Further, the width "a" of the cylindrical lenses 202 in FIG. 2 must be 5 mm or less. Again, the direction of this width must coincide or substantially coincide with the longitudinal direction of the line into which the laser beam is ultimately shaped.

The length of the linear laser beam used for the annealing that provided the result as shown in FIG. 3(A) was 12 cm in its longitudinal direction. Any change in the length of the laser beam in the longitudinal direction still results in a difference in the effect of annealing as shown in FIGS. 3(A) and 3(B).

Homogeneous annealing as shown in FIG. 3(A) can be achieved when the above-described conditions are satisfied.

If there is any deviation from the above-described conditions, a vertically extending stripe pattern will be observed as shown in FIG. 3(B). This stripe pattern originates from variation in the radiation energy density of the linear laser beam in the longitudinal direction thereof.

The horizontally extending stripe pattern in the photograph (horizontal stripes) is variation caused during irradiation with a linear laser beam which is being scanned and is simply attributable to insufficient compliance to the conditions for radiation.

The difference in the effect of annealing as indicated by FIGS. 3(A) and 3(B) is attributable to improper setting of the optical parameters of the homogenizer 104.

According to one aspect of the present invention, there is provided an apparatus for radiating a linear laser beam characterized in that the width of cylindrical lenses forming a homogenizer for controlling the distribution of energy density of the linear laser beam in the longitudinal direction thereof is in the range from 0.1 mm to 5 mm.

According to another aspect of the invention, there is provided an apparatus for radiating a linear laser beam characterized in that the length (mm) of the linear laser beam in the longitudinal direction thereof and the number of cylindrical lenses forming a homogenizer for controlling the distribution of energy density of the linear laser beam in the longitudinal direction thereof are in the range defined by coordinates represented by (100, 7), (700, 50), (700, 140), and (100, 20).

Figure 7:
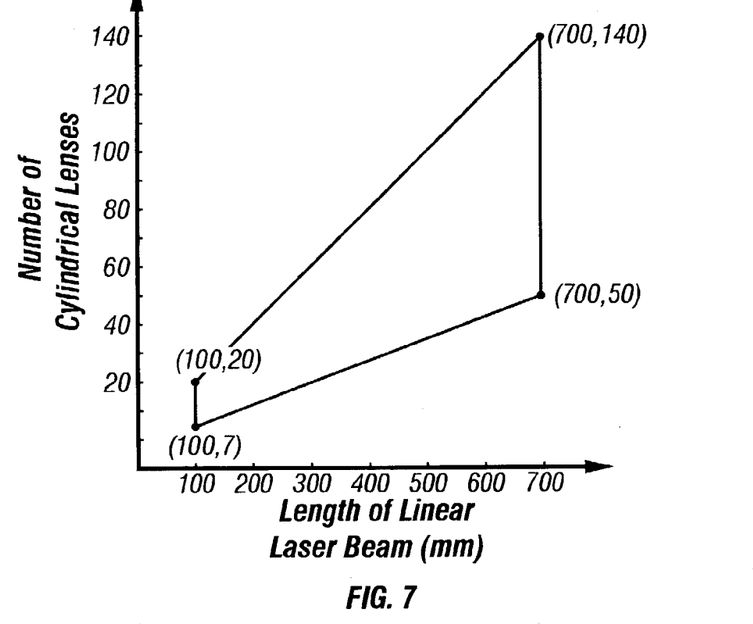
FIG. 7 illustrates the relationship between the number of cylindrical lenses and the length of a linear laser beam in the longitudinal direction thereof.

The above-described coordinates are shown in FIG. 7. The relationship shown in FIG. 7 indicates that high homogeneity is achieved when the length of the linear laser ultimately radiated in the longitudinal direction thereof that corresponds to one cylindrical lens is generally in the range from 5 mm to 15 mm.

According to another aspect of the present invention, there is provided an apparatus for radiating a linear laser beam characterized in that it comprises a homogenizer for controlling the distribution of energy density of the linear laser beam in the longitudinal direction thereof and in that the width (mm) of the laser beam incident upon the homogenizer corresponding to the longitudinal direction and the width (mm) of cylindrical lenses forming the homogenizer are in the range defined by coordinates represented by (30, 0.1), (80, 0.1), (80, 5), (50, 5) and (30, 3).

Figure 8:
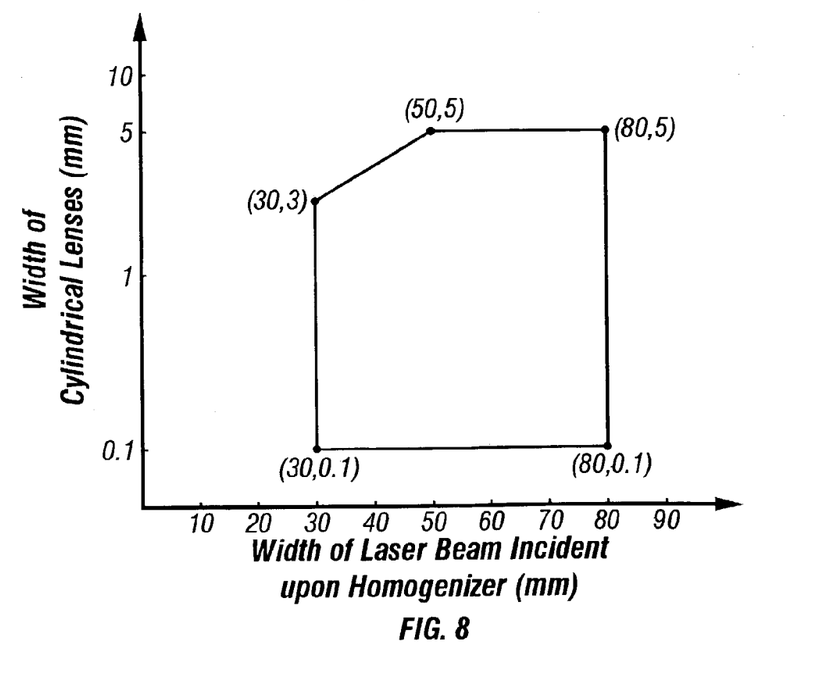
FIG. 8 illustrates the relationship between the width of cylindrical lenses and the width of a laser beam incident upon a homogenizer.

The above-described coordinates are shown in FIG. 8. The relationship shown in FIG. 8 satisfies a condition that the width of the laser beam incident upon the homogenizer is in the range from 30 mm to 80 mm; the laser beam is divided by the homogenizer into 10 or more beams; and the width of the cylindrical lenses is in the range from 0.1 mm to 5 mm.

The homogenizer has a configuration as indicated by 201 in FIG. 2 and is constituted by a multiplicity of cylindrical lenses indicated by 202.

For example, the homogenizer for controlling the distribution of the energy density of a linear laser beam in the longitudinal direction thereof is indicated by 103 and 104 in FIGS. 1(A) and 1(B).

DETAILED DESCRIPTION OF PREFERRED EMBODIMENTS

A first embodiment of the present invention will now be described.

The present embodiment relates to an optical system in which the number of homogenizers can be one half of that in the optical system shown in FIGS. 1(A) and 1(B).

Figure 6A:
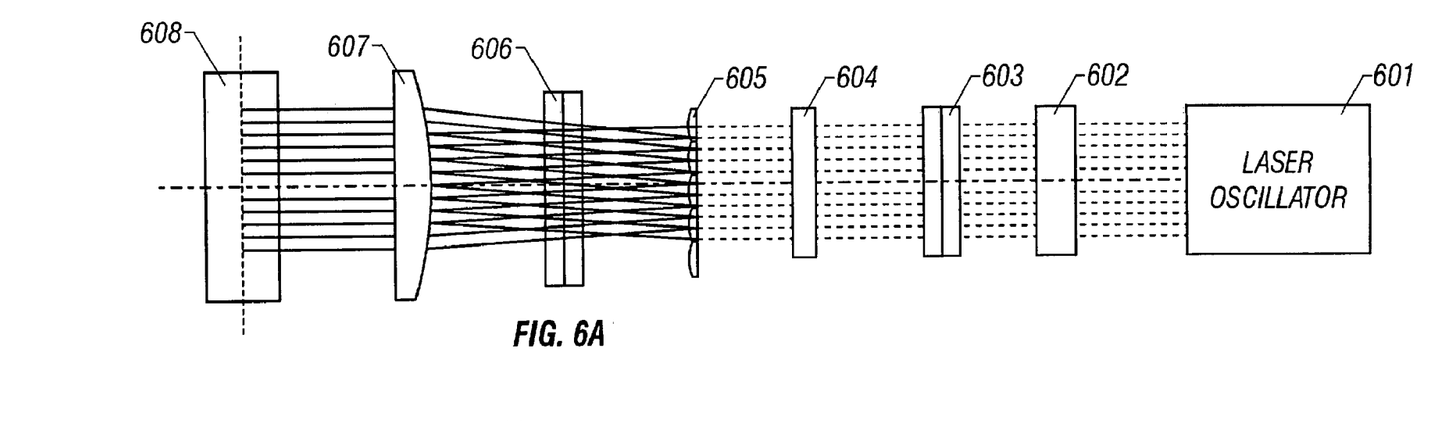
FIGS. 6(A) and 6(B) schematically show an optical system of a laser radiation apparatus.
Figure 6B:
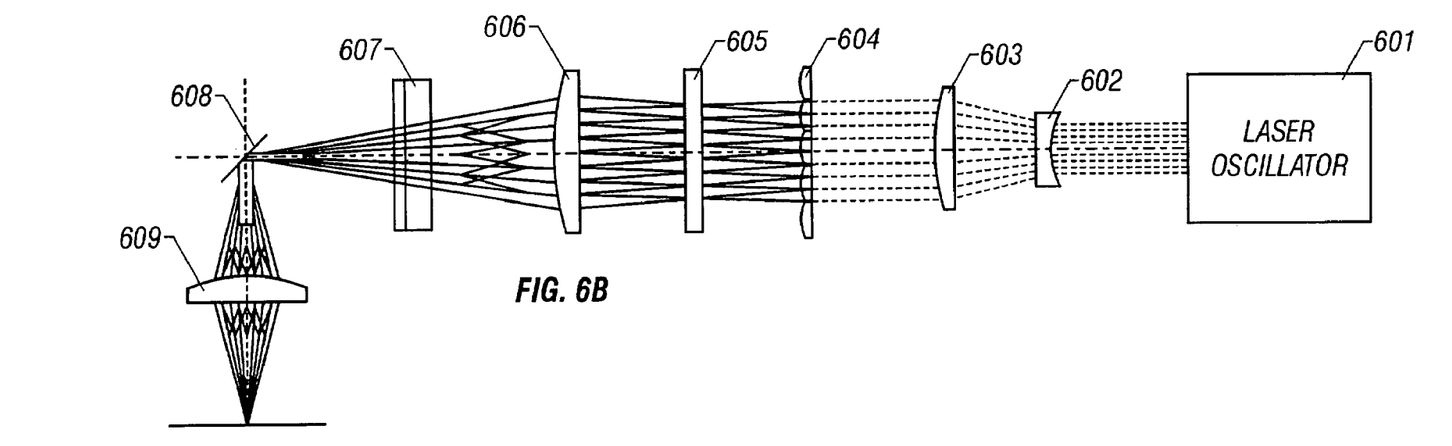

FIGS. 6(A) and 6(B) show the optical system of the present embodiment. In the optical system shown in FIGS. 6(A) and 6(B), a laser beam oscillated by an oscillator 601 is shaped by an optical system constituted by lenses 602 and 603 into a laser beam having a predetermined beam shape and predetermined distribution of energy density.

The distribution of the energy density in this laser beam is corrected by two homogenizers 604 and 605.

The homogenizer 604 has a function of correcting the energy density of the laser beam which is ultimately shaped into a linear configuration in the direction of the width of the same. However, since the dimension of the linear laser beam in the direction of its width is on the order of a few millimeters, the effect of the homogenizer 604 is not so significant.

The homogenizer 605 has a function of correcting the energy density of the laser beam which is ultimately shaped into a linear configuration in the longitudinal direction of the same. Since the laser beam extends 10 cm or more, the optical parameters of this homogenizer 605 must be carefully set.

Lenses 606, 607 and 609 have a function of shaping a laser beam into a linear configuration. 608 designates a mirror.

The configuration shown in FIGS. 6(A) and 6(B) is characterized in that only the homogenizer 605 has major parameters that decide whether or not variation occurs in the radiation energy density of a linearly shaped laser beam in the longitudinal direction thereof. Therefore, the configuration is characterized in that it is easy to set optical parameters for preventing the occurrence of variation in annealing in the longitudinal direction of a linear laser.

In the configuration shown in this embodiment, the homogenizer 605 is formed by twelve cylindrical lenses (having a width of 5 mm) and a laser beam incident thereupon is split into ten beams.

Specifically, the homogenizer is provided with some redundancy relative to a laser beam such that the ten inner cylindrical lenses are mainly used. The width of the homogenizer is larger than the width of the laser beam incident upon the homogenizer.

In the present embodiment, the length of the ultimately radiated linear laser beam is 12 cm in its longitudinal direction.

The use of the configuration shown in this embodiment makes it possible to correct variation in the energy density of a linear laser beam in the longitudinal direction thereof and to perform homogeneous annealing on a semiconductor material.

A second embodiment of the present invention will now be described.

Figure 4A:
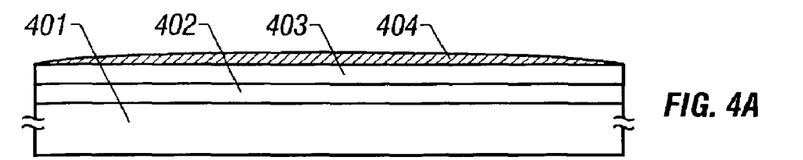
FIGS. 4(A) through 4(F) illustrate steps of fabricating a thin film transistor.

The present embodiment shows an example of fabrication of a thin film transistor utilizing the present invention. FIGS. 4(A) though 4(F) illustrate steps of fabricating a thin film transistor.

First, a silicon oxide film or silicon nitride film 402 as a backing layer is formed to a thickness of 3000 Å on a glass substrate indicated by 401 using a sputtering process or plasma CVD process.

Next, an amorphous silicon film 403 is formed to a thickness of 500 Å using a plasma CVD process or low pressure thermal CVD process. The use of a low pressure thermal CVD process is preferred as a means for forming the amorphous film 403 from the viewpoint of fineness of the film and crystallinity of a crystalline silicon film produced later therefrom.

In order to improve the effect of annealing using irradiation with a laser beam, it is important that the thickness of the amorphous film 403 is 1000 Å or less and more preferably 500 Å or less. The lower limit for the thickness of the amorphous film 403 is about 200 Å.

Next, a metal element for promoting crystallization of silicon is introduced. Ni is used here as the metal element for promoting crystallization of silicon. Instead of Ni, it is possible to use Fe, Co, Cu, Pd, Pt, Au, etc.

Here, Ni is introduced using a nickel acetate solution. Specifically, a nickel acetate solution prepared to have a predetermined concentration of Ni (10 ppm by weight here) is first dropped on the surface of the amorphous silicon film 403. Thus, an aqueous film 404 made of the nickel acetate solution is formed (FIG. 4(A)).

Next, spin drying is performed using a spin coater (not shown) to blow out any excess solution. Further, a heating process is performed for four hours at 550° C. to obtain a crystalline silicon film 405 (FIG. 4(B)).

Figure 4B:
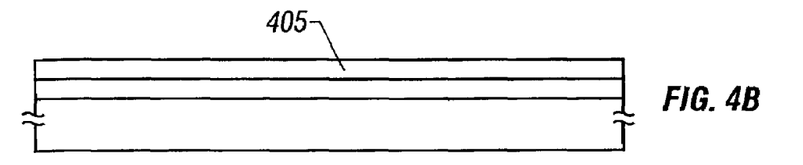

When the crystalline silicon film 405 is obtained, it is irradiated with a laser beam. The irradiation with a laser beam improves the crystallinity. Here, laser annealing is carried out by irradiating with a KrF excimer laser whose beam is processed into a linear shape while scanning the laser.

Figure 5:
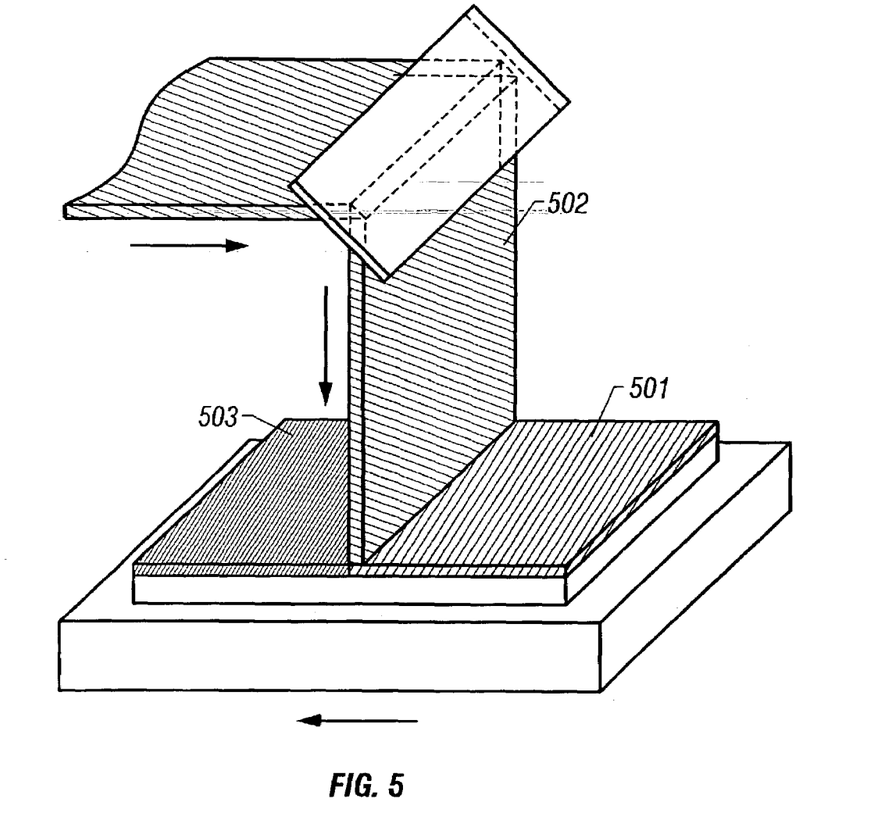
FIG. 5 illustrates radiation of a linear laser beam.

FIG. 5 shows this laser annealing process. The laser beam is shaped into a linear configuration as indicated by 502 using the optical system as shown in FIGS. 1(A) and 1(B).

By moving the substrate in the direction of the arrow in FIG. 5 during irradiation, the linear laser beam is radiated such that it is scanned in the direction perpendicular to the longitudinal direction of the linear configuration.

In FIG. 5, 501 designates a region which has not been irradiated with the laser beam yet while 503 designates a region which has already been irradiated with the laser beam.

Here, the optical parameters of a homogenizer as shown in FIG. 2 are set such that the width thereof indicated by "a" becomes 5 mm or less (the lower limit is preferably about 0.1 mm) and such that it splits a laser beam incident thereupon into ten or more beams.

This makes it possible to correct variation in the radiation energy density of the linear laser beam 502 in the longitudinal direction thereof and to homogenize the effect of annealing in the same direction.

Figure 9:
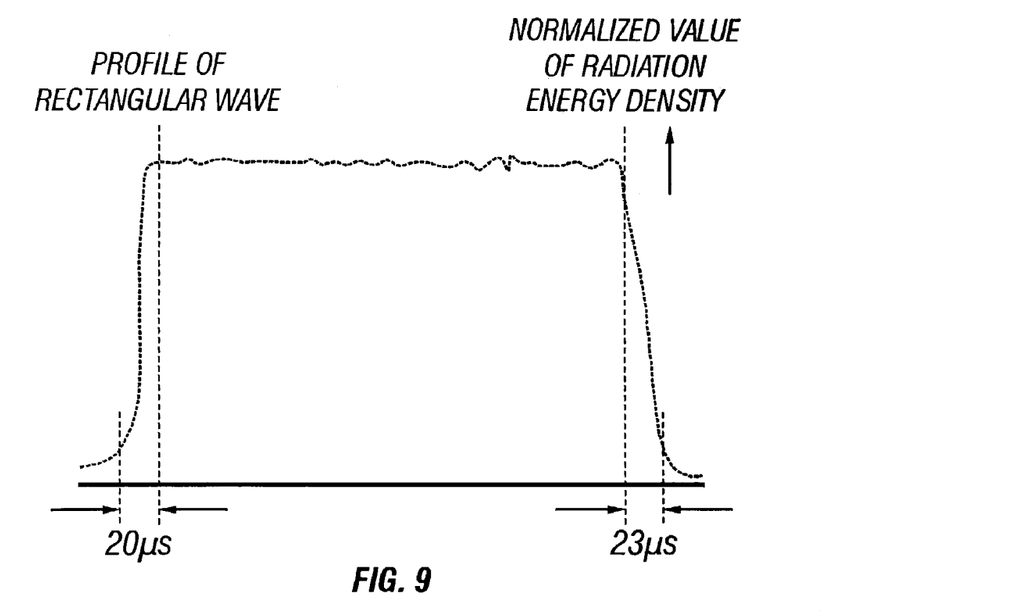
FIG. 9 shows a beam profile of a rectangular laser wave which has been passed through a homogenizer split into nine parts.

FIG. 9 shows an example of a profile of a rectangular wave laser beam which is split by the homogenizer into nine beams. The profile of the rectangular wave laser beam corresponds to a beam profile of a linear laser in the direction of the width thereof.

Figure 10:
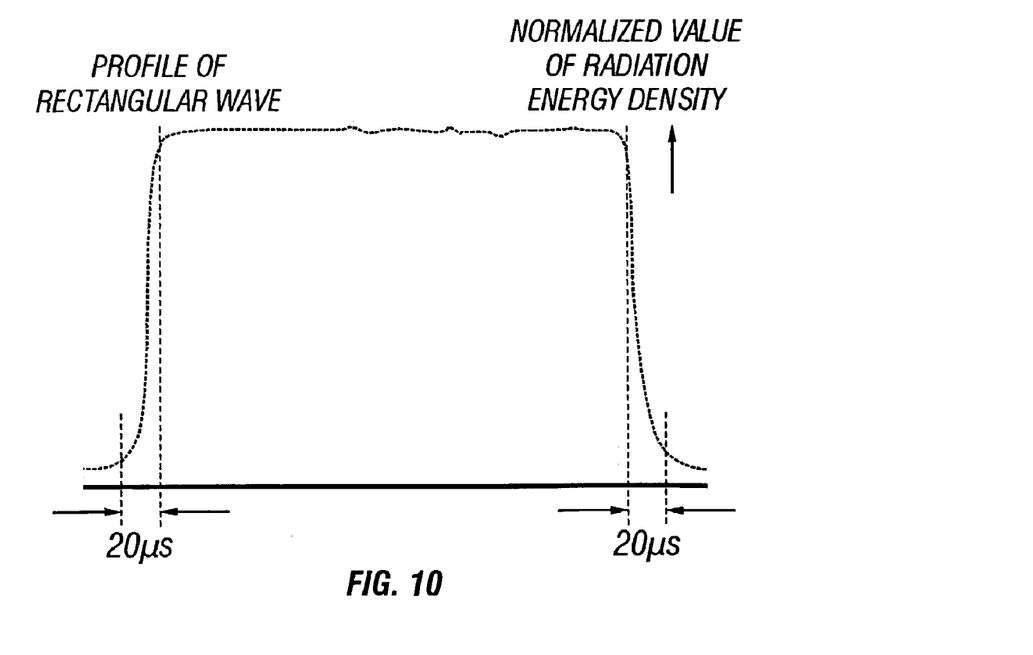
FIG. 10 shows a beam profile of a rectangular laser wave which has been passed through a homogenizer split into eighteen parts.

FIG. 10 shows an example of a profile of a rectangular wave laser beam which is split by the homogenizer into eighteen beams. As apparent from comparison between FIGS. 9 and 10, the homogeneity of a laser beam can be improved by splitting it into an increased number of beams.

The higher energy density in FIG. 10 is regarded attributable to a difference in loss between the different optical systems.

Figure 4C:
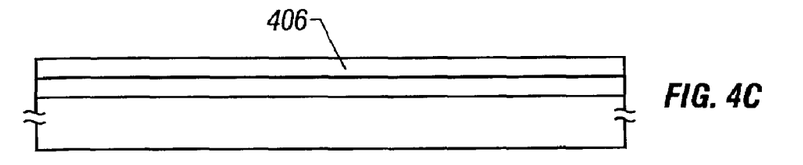

Laser annealing as shown in FIG. 4(C) is performed to obtain a crystalline silicon film 406 having higher crystallinity.

Figure 4D:
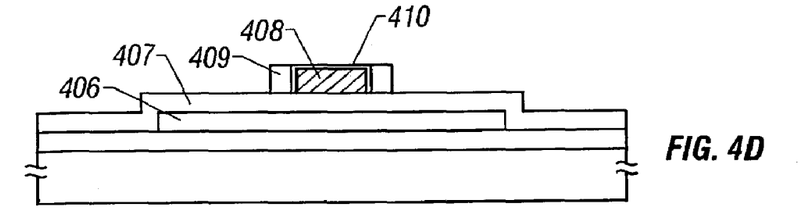

Patterning is then performed to form a region 406 which is to serve as an active layer of a thin film transistor (FIG. 4(D)).

Further, a silicon oxide film 407 is formed which covers the active layer 406 to serve as a gate insulation film. Here, a silicon oxide film having a thickness of 1000 Å is formed using a plasma CVD process as the gate insulation film 407.

Next, an aluminum film (not shown) having a thickness of 5000 Å is formed which is to serve as a gate electrode. The aluminum film includes 0.1% scandium by weight for preventing the occurrence of hillocks and whiskers during subsequent steps.

Hillocks and whiskers are protrusions in the form of needles or thorns formed as a result of abnormal growth of aluminum.

A resist mask (not shown) is then provided to pattern an aluminum film (not shown). Thus, a pattern is formed which is to constitute a gate electrode 408. When the pattern to constitute the gate electrode 408 is formed, an anodic oxide film is formed with the above-described resist mask left in place.

Here, an aqueous solution including 3% nitric acid is used as the electrolyte. Specifically, a current is applied between the aluminum film pattern (not shown) serving as an anode and platinum serving as a cathode in this aqueous solution to form an anodic oxide film on an exposed surface of the aluminum film pattern.

The anodic oxide film 409 formed in this step is porous. Further, the porous anodic oxide film is formed on lateral sides of the pattern as indicated by 409 because of the presence of the resist mask (not shown).

The thickness of the porous anodic oxide film 409 is 3000 Å. An offset gate region can be formed with the same thickness as this porous anodic oxide film 409.

Next, the resist mask (not shown) is removed, and anodization is performed again. The electrolyte used in this step is an ethylene glycol solution including 3% tartaric acid neutralized by ammonia.

An anodic oxide film 410 formed in this step has fine film quality. In this step, the fine anodic oxide film 410 having a thickness of 500 Å is formed through adjustment of the applied voltage.

Since the electrolyte enters the porous anodic oxide film 409, the anodic oxide film having fine film quality is formed in contact with the gate electrode 408 as indicated by 410.

If this anodic oxide film having fine film quality is made thick, an offset gate region having the same thickness can be formed later. In this case, however, such a contribution to the formation of an offset gate region is ignored because the thickness is small.

Thus, the state as shown in FIG. 4(D) is achieved. when the state as shown in FIG. 4(D) is achieved, ion implantation is carried out to form source and drain regions. P (phosphorus) ions are implanted here to fabricate an N-channel type thin film transistor.

When the implantation of impurity ions is performed in the state as shown in FIG. 4(D), the impurity ions are implanted in regions indicated by 411 and 415. Regions 412 and 414 are regions in which no impurity ion is implanted and which are not subjected to a field effect of the gate electrode 408. The regions 412 and 414 serve as offset gate regions.

The region indicated by 413 serves as a channel formation region. Thus, the state as shown in FIG. 4(E) is achieved.

When the above-described implantation of impurity ions is finished, a laser beam is radiated to activate the regions in which the impurity ions have been implanted. The radiation of a laser beam is also performed using a laser radiation apparatus having the optical system as shown in FIGS. 1(A) and 1(B) and an irradiation method as shown in FIG. 5.

Figure 4E:
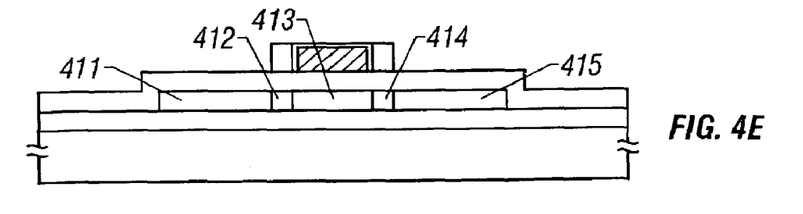

When the state as shown in FIG. 4(E) is achieved, a layer insulation film 416 is formed of a silicon oxide film, silicon nitride film, silicon oxynitride film, or a laminated film consisting of them.

Figure 4F:
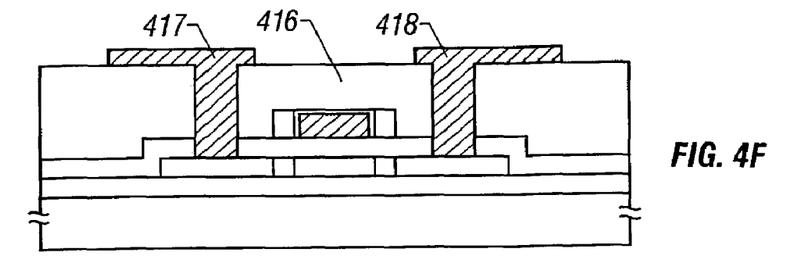

Contact holes are then formed to form a source electrode 417 and a drain electrode 418. Thus, a thin film transistor as shown in FIG. 4(F) is completed.

A third embodiment of the present invention will now be described.

The present embodiment is an example wherein an XeCl laser (having a wavelength of 308 nm) is used in the configuration as described in the second embodiment.

The use of a KrF excimer laser having a short wavelength (248 nm) is preferred from the viewpoint of the annealing effect on the silicon film. This is because a laser beam having a shorter wavelength is more easily absorbed by the silicon film.

However, when the maintenance of the apparatus and the stability of the oscillator is taken into consideration, it is preferable to use an XeCl excimer laser having a wavelength longer than that of a KrF excimer laser.

The reason is that a longer wavelength means lower photon energy (hν) and a lighter load to the optical system and oscillator.

A fourth embodiment of the present invention will now be described.

What is implied by FIG. 7 is that it is preferable in view of the homogeneity of irradiation density that the length of a laser beam on the final irradiation plane, as corresponding to one of cylindrical lenses constructing a homogenizer, is set to about 5 mm to 15 mm.

In other words, it is preferable that the quotient, as calculated by dividing the longitudinal length of the linear laser beam on the irradiation plane by the number of cylindrical lenses, be about 5 mm to 15 mm.

If the aforementioned condition is satisfied, the length of the linear laser beam on the irradiation plane may be 700 mm or more.

Figure 11:
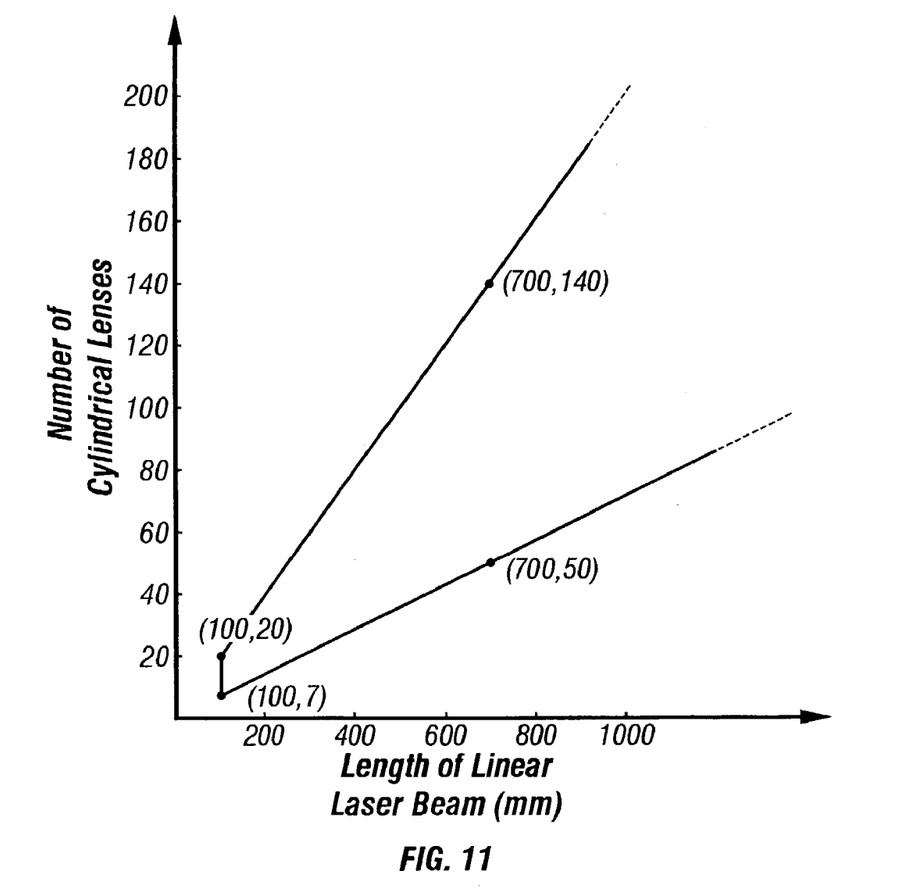
FIG. 11 illustrates the relationship between the number of cylindrical lenses and the length of a linear laser beam in the longitudinal direction thereof.

The present embodiment should not be limited to the condition, as specified in FIG. 7, but relates to an example, in which the upper limit of the longitudinal length of the linear laser beam on the irradiation plane is not restricted, as shown in FIG. 11.

In this example, the combination of the length x of the linear laser beam on the irradiation plane and the number y of the cylindrical lenses can be selected to satisfy the. formula: $(43/600)x-(1/6) \leq y \leq (x/5)$. Here, the length x is preferably selected from the range of $x \geq 7$, more preferably $x \geq 10$.

If the length of the linear laser beam on the irradiation plane is 1000 mm, for example, the number of cylindrical lenses may be selected from the range of 72 to 200.

If there is utilized a homogenizer having one hundred cylindrical lenses, on the contrary, the length of the linear laser beam on the irradiation plane may be selected from the range of 500 to 1,398 mm. In other words, the optical system may be so designed that the length of the linear laser beam on the irradiation plane be confined within the range of 500 mm to 1,398 mm.

Incidentally, it is important that the width of the cylindrical lens be selected from the range of 0.1 mm to 5 mm, when the combination of the length of the linear laser beam on the irradiation plane and the number of cylindrical lenses is selected from the range of the aforementioned formula.

The use of the present invention makes it possible to provide a technique which allows homogeneous annealing on a larger area during a laser process utilized in fabrication of a semiconductor device.

Although preferred embodiments of the present invention have been illustrated and described, various alternatives, modifications and equivalents may be used. Therefore, the foregoing description should not be taken as limiting the scope of the invention which is defined by the appended claims.

What is claimed is:

1. A method for forming a semiconductor device comprising:
   forming a semiconductor film comprising silicon to become at least a channel formation region over a substrate;
   splitting a linear laser light by cylindrical lenses;

irradiating said linear laser light to said semiconductor film; and forming a gate electrode adjacent to said semiconductor film with a gate insulating film therebetween, wherein the number y of said cylindrical lenses and the length x (mm) of said linear laser light on said semiconductor film satisfy a formula: $(43/600)x-(1/6) \leqq y \leqq (x/5)$.

2. A method for forming a semiconductor device comprising:

forming a semiconductor film comprising silicon to become at least a channel formation region over a substrate;

splitting a linear laser light by cylindrical lenses; and irradiating said linear laser light to said semiconductor film, wherein the number y of said cylindrical lenses and the length x (mm) of said linear laser light on said semiconductor film satisfy a formula: $(43/600)x-(1/6) \leqq y \leqq (x/5)$.

3. A method according to claim 1 wherein said laser light is selected from the group consisting of a KrF excimer laser light and a XeCl excimer laser light.

4. A method according to claim 1 further comprising the step of crystallizing said semiconductor film by heat treatment to form the crystallized semiconductor film wherein crystallinity of said crystallized semiconductor film is improved by the irradiation of said linear laser light.

5. A method according to claim 1 further comprising the step of crystallizing said semiconductor film by heat treatment to form the crystallized semiconductor film wherein said crystallized semiconductor film is annealed by the irradiation of said linear laser light.

6. A method according to claim 2 wherein said laser light is selected from the group consisting of a KrF excimer laser light and a XeCl excimer laser light.

7. A method according to claim 2 further comprising the step of crystallizing said semiconductor film by heat treatment to form the crystallized semiconductor film wherein crystallinity of said crystallized semiconductor film is improved by the irradiation of said linear laser light.

8. A method according to claim 2 further comprising the step of crystallizing said semiconductor film by heat treatment to form the crystallized semiconductor film wherein said crystallized semiconductor film is annealed by the irradiation of said linear laser light.

9. A method according to claim 1, wherein the linear laser light is split in a longitudinal direction of the irradiated linear laser light.

10. A method according to claim 2, wherein the linear laser light is split in a longitudinal direction of the irradiated linear laser light.

* * * * *